United States Patent
Weng et al.

(10) Patent No.: US 7,126,221 B2
(45) Date of Patent: Oct. 24, 2006

(54) SEMICONDUCTOR PACKAGE

(75) Inventors: Gwo-Liang Weng, Kaohsiung (TW); Yung-Li Lu, Linyuan Township, Kaohsiung County (TW); Chi-Chih Chu, Kaohsiung (TW); Shih-Chang Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 110 days.

(21) Appl. No.: 10/868,495

(22) Filed: Jun. 14, 2004

(65) Prior Publication Data

US 2005/0275074 A1 Dec. 15, 2005

(51) Int. Cl.
*H01L 23/48* (2006.01)
*H01L 23/52* (2006.01)
*H01L 23/40* (2006.01)

(52) U.S. Cl. .................. 257/738; 257/777; 257/778; 257/780

(58) Field of Classification Search ........ 257/737–738, 257/777–796
See application file for complete search history.

(56) References Cited

U.S. PATENT DOCUMENTS 6,400,033 B1 * 6/2002 Darveaux .................. 257/778
6,570,259 B1 * 5/2003 Alcoe et al. ............... 257/778

* cited by examiner

*Primary Examiner*—Cuong Nguyen
(74) *Attorney, Agent, or Firm*—J.C. Patents

(57) ABSTRACT

A semiconductor package comprising a substrate and a semiconductor device disposed on the substrate by flip-chip bonding. The present invention is characterized by a connection structure disposed between the semiconductor device and the substrate that extends along the periphery of the bottom surface of the semiconductor device. As a result, it can preferably provide additional mounting support between the two. The connection structure can be formed from cured adhesive. The present invention also provides a method of manufacturing the semiconductor package.

7 Claims, 5 Drawing Sheets

SEMICONDUCTOR PACKAGE

BACKGROUND OF THE INVENTION

1. Field of the Invention

The present invention relates to a semiconductor package and method of manufacturing the same.

2. Description of the Related Art

FIG. 1 is a schematic cross-sectional view of a conventional semiconductor package. As shown in FIG. 1, the semiconductor package 100 has a semiconductor device 102 flip-chip bonded (for example, through a plurality of solder balls 108) to a substrate 104. An underfill layer 106 is formed in the space between the semiconductor device 102 and the substrate 104 to increase the mechanical strength of the bondage between the semiconductor device 102 and the substrate 104, and fix their positions relative to each other. Hence, the semiconductor package 100 is prevented from possible dissociation or deformation when it is subjected to a surface bonding process.

However, moisture buried within the underfill layer 106 and volatile pollutants trapped on the surface of the semiconductor device 102 and the substrate 104 may vaporize and expand when it is subjected to heat. As a result, voids are produced in the underfill layer 106. These voids may cause the delamination of the underfill layer 106 from the semiconductor device 102 or substrate 104. Moreover, the heat-produced moisture or pollutants are still enclosed by the underfill layer 106 under thermal vaporization, incapable of dissipating away. Hence, the moisture and pollutants may condense on the solder balls 108 when the temperature drops leading to the possible formation of a conductive bridge between neighboring solder balls 108. In general, the gap between the semiconductor device 102 and the substrate 104 is relatively small so that it is very difficult to have a controlled injection of underfill material into the space, and the problem of effusion occurs often.

SUMMARY OF THE INVENTION

Accordingly, at least one objective of the present invention is to provide a semiconductor package structure capable of rectifying the underfill material injection problems in a conventional manufacturing method.

To achieve these and other advantages and in accordance with the purpose of the invention, as embodied and broadly described herein, the invention provides a semiconductor package. The semiconductor package mainly comprises a substrate and a semiconductor device disposed on the substrate by flip-chip bonding. The semiconductor device can be a chip or a semiconductor package structure such as a chip scale package. The present invention is characterized by a connection structure disposed between the semiconductor device and the substrate that extends along at least a portion of the periphery of the bottom surface of the semiconductor device, for example by a full portion, a single partial portion, or discrete portions. As a result, it can preferably provide additional mounting support between the two. The connection structure is preferably formed from cured adhesive.

Because the connection structure runs along the periphery of the bottom surface of the semiconductor device, the connection structure not only stabilizes and provides additional support to the package but also reduces stresses between the semiconductor device and the substrate. Ultimately, the semiconductor package can be subjected to a higher stress without delamination.

The connection structure can have a spot-like or line configuration. Moreover, the connection structure may form on a particular section of along at least a portion of the periphery at the bottom surface of the semiconductor device, for example by a full portion, a single partial portion, or discrete portions, so that any moisture or pollutants released from the interior of the semiconductor device due to heating may escape through the gaps in the connection structure. However, the connection structure can have a continuous configuration lining the periphery of the bottom surface of the semiconductor device so that the entire space between the semiconductor device and the substrate is sealed off to prevent moisture or pollutants from entering the semiconductor package.

Furthermore, a suitable adhesive (for example, a soft plastic material) can be selected to form a connection structure having a desired degree of flexibility so that the connection structure may serve as a buffer to protect the semiconductor package against shock.

The present invention also provides a method of manufacturing a semiconductor package. First, a semiconductor device is disposed over a substrate and then flip-chip bonded to the substrate. Thereafter, adhesive material is coated along at least a portion of the periphery at the bottom surface of the semiconductor device to form an adhesive structure, for example by a full portion, a single partial portion, or discrete portions. Finally, the adhesive structure is cured to form a connection structure.

According to one embodiment of the present invention, the coating of adhesive on the bottom surface of the semiconductor device can be carried out before the semiconductor device is flip-chip bonded to the substrate. In essence, flip-chip bonding comprises performing a reflow process at a high temperature to melt a plurality of solder balls and then cool down the solder balls to form connections between the semiconductor package and the substrate. In the present embodiment, an adhesive material having a curing temperature close to the melting point of the solder balls can be selected so that the connection structure is formed after the reflow process. After coating the adhesive material on the bottom surface of the semiconductor device, the high temperature reflow process can be used to bond the semiconductor package and the substrate together and cure the adhesive at the same time. In other words, there is considerable saving in processing step and processing time.

Since the present invention demands the coating of adhesive along at least a portion of the bottom periphery of the semiconductor device instead of injecting underfill material into the gap between the semiconductor device and the substrate, less material can be used. Thus, the fabricating method of the present invention not only reduces the effusion adhesive material but also speeds the production of the connective structure.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
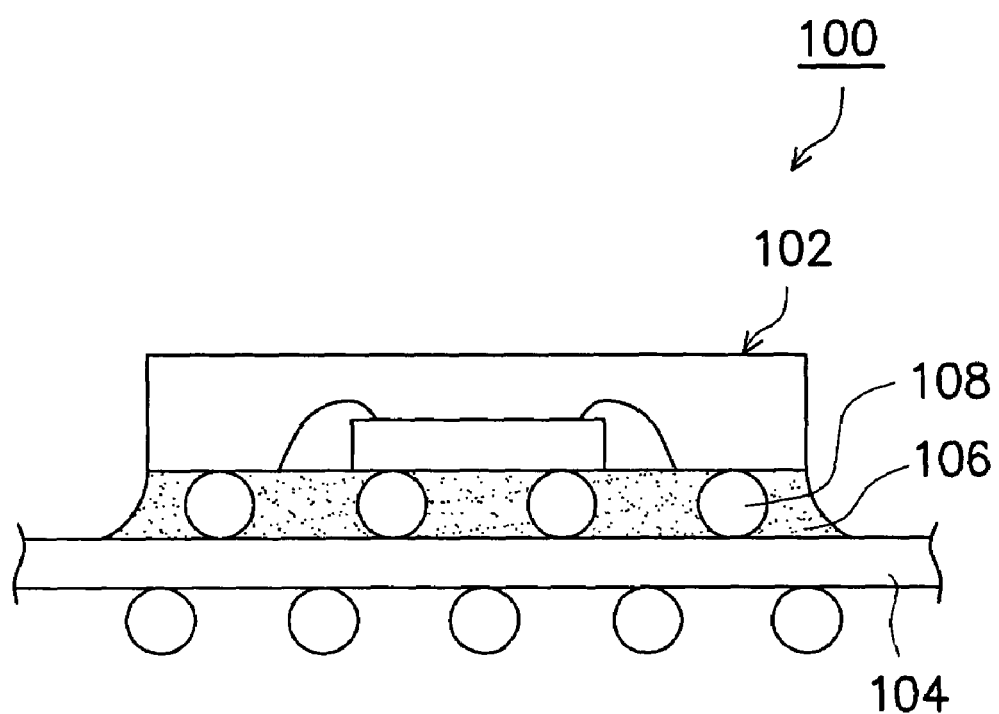
FIG. 1 is a schematic cross-sectional view of a conventional semiconductor package.

Reference will now be made in detail to the present preferred embodiments of the invention, examples of which are illustrated in the accompanying drawings. Wherever possible, the same reference numbers are used in the drawings and the description to refer to the same or like parts.

Figure 2:
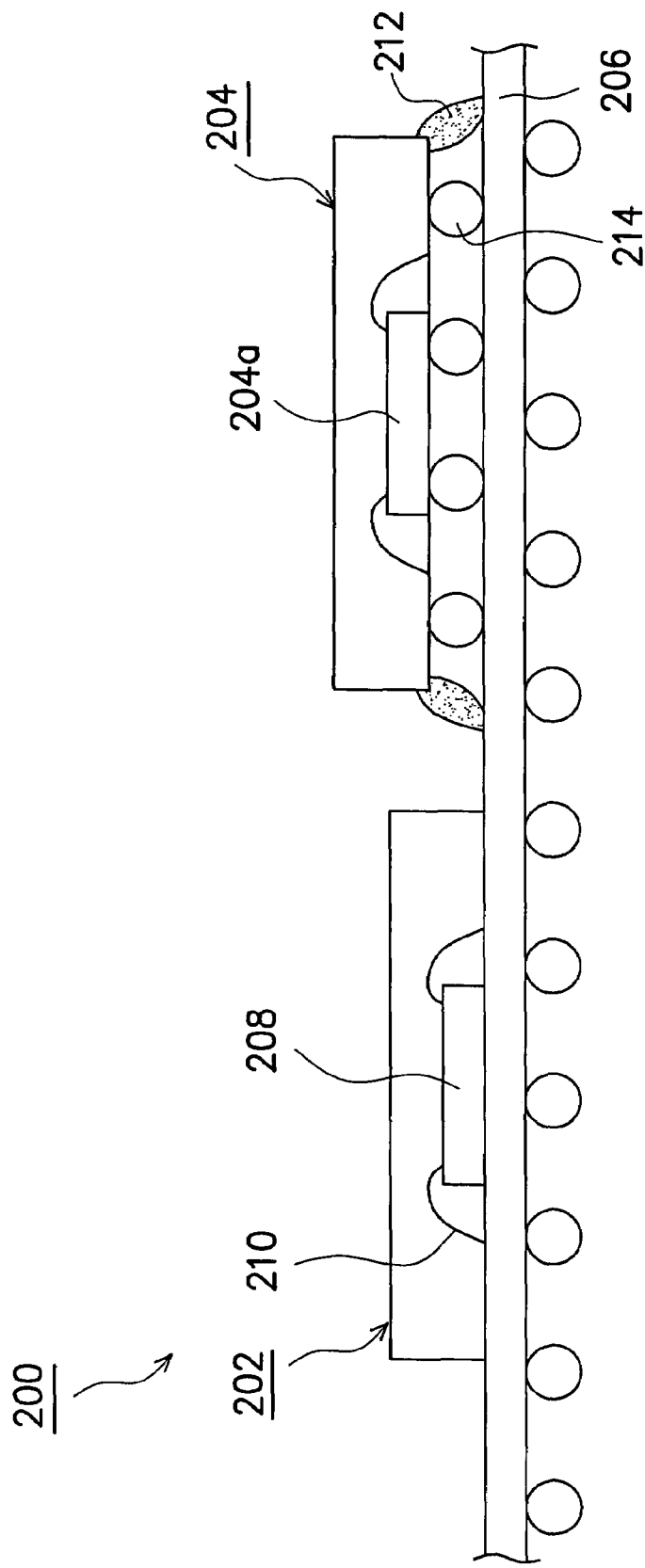
FIG. 2 is a schematic cross-sectional view of a semiconductor package according to one embodiment of the present invention.

FIG. 2 is a schematic cross-sectional view of a semiconductor package according to one embodiment of the present invention. As shown in FIG. 2, the semiconductor package 200 mainly comprises a first semiconductor device 202 and a second semiconductor device 204. The first semiconductor device 202 and the second semiconductor device 204 are semiconductor packages. The first semiconductor device 202 comprises a substrate 206, a semiconductor chip 208 disposed on the substrate 206 and electrically connected to the semiconductor device 202 through a plurality of conductive wires 210. The second semiconductor device 204 is flip-chip bonded (for example, through a plurality of solder balls 214) to the substrate 206. In the present embodiment, the second semiconductor device 204 is a chip scale package, for example. A connection structure 212 is disposed between the second semiconductor package 204 and the substrate 206.

In the present embodiment, the chip 208 is a main functional chip while the second semiconductor device 204 contains a chip 214a that performs subsidiary functions (for example, ordinary memory or flash memory). Because the semiconductor package 200 comprises two semiconductor devices 202 and 204, the semiconductor devices 202 and 204 may shift in position or detach from the substrate 206 when heated in a subsequent surface mounting process (for example, bonding the package 200 to a printed circuit board). Conventionally, an underfill layer (as shown in FIG. 1) is formed in the gap between the second semiconductor device 204 and the substrate 206 so that the second semiconductor device 204 is still fastened to the substrate 206 at a high temperature. However, the underfill material often contains a little bit of moisture or contaminants that may vaporize into bubbles when heated. These bubbles create voids cause a delamination of the underfill layer, thereby weakening the connections and supports through the underfill layer. Furthermore, the moisture and pollutants will condense on the solder balls 214 to form connective bridge that shorts nearby solder balls 214 when the temperature drops.

The present invention provides a connection structure 212 fabricated from a cured adhesive material to replace the conventional underfill material layer. The connection structure 212 serves to fix the second semiconductor device 204 on the substrate 206 and provide a support that maintains a constant separation between the second semiconductor device 204 and the substrate 206 under thermal stress. It should be noted that the connection structure 212 extends along the bottom periphery of the second semiconductor device 204 without completely filling the space between the second semiconductor device 204 and the substrate 206. For example, it can be a full portion, a single partial portion, or discrete portions. Therefore, the connection structure 212 reduces the junction area with the semiconductor device 204 and the substrate 206 considerably and hence reduces the probability of having a delamination.

Figure 3:
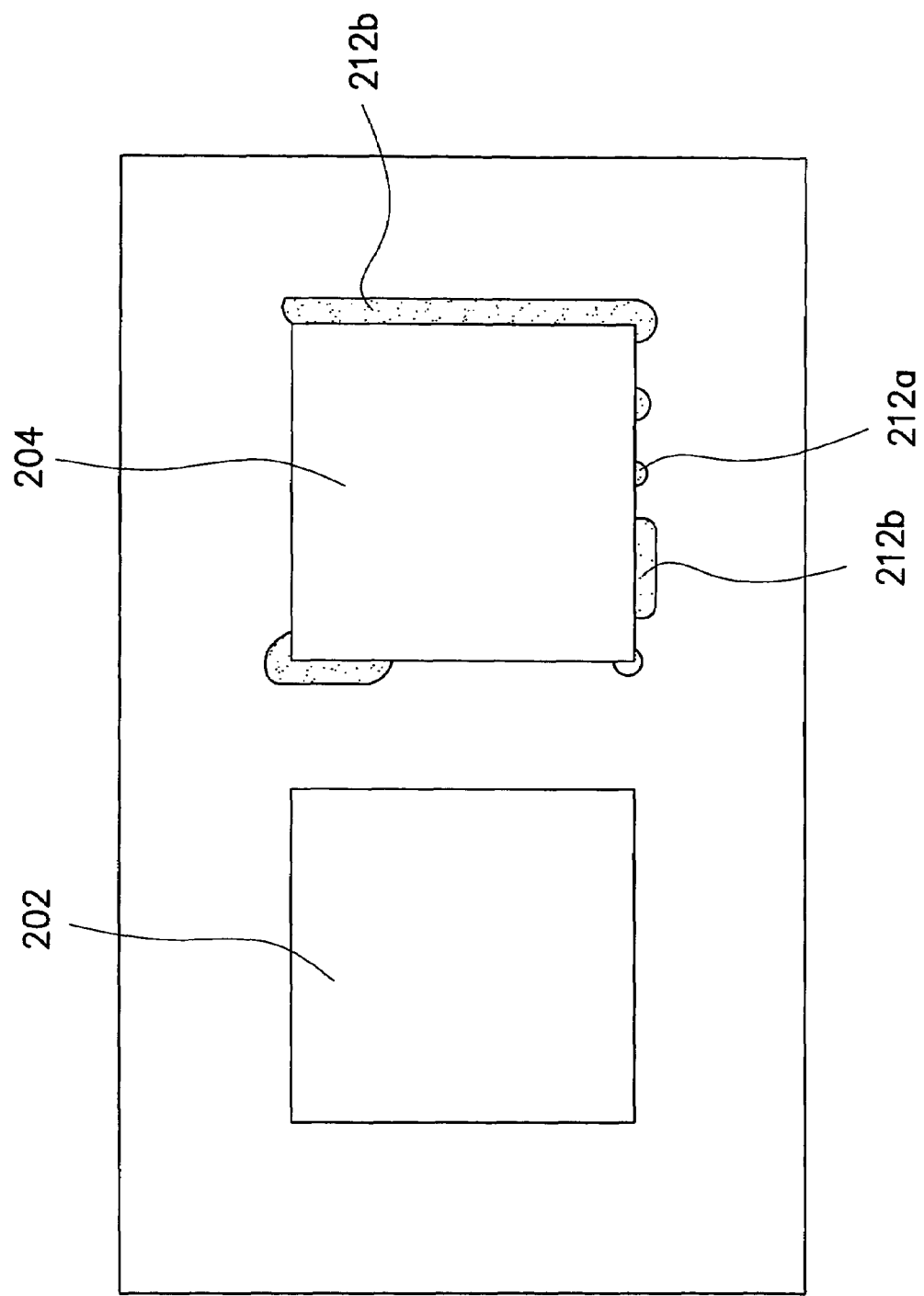
FIG. 3 is a top view of the semiconductor package shown in FIG. 2.
Figure 4:
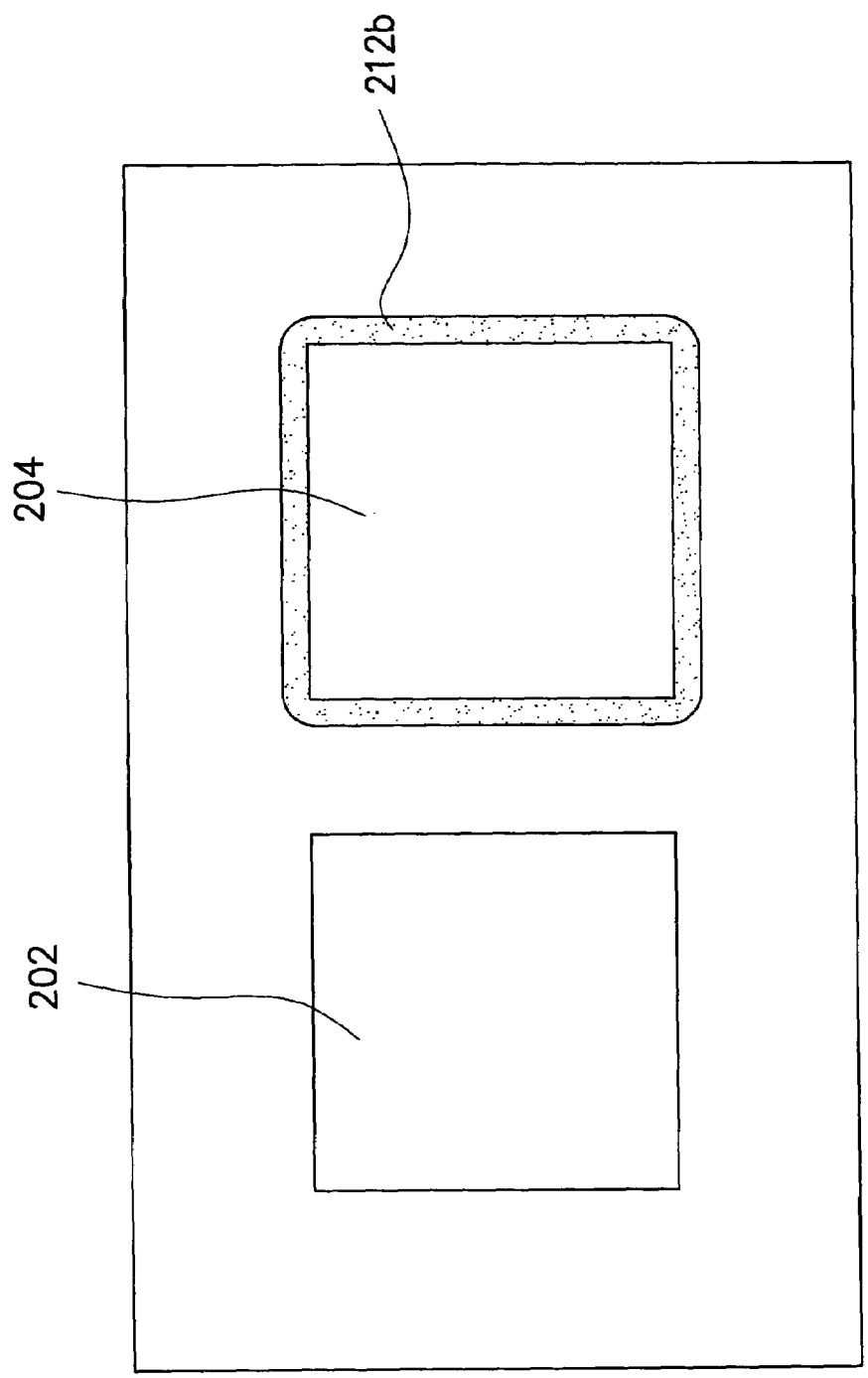
FIG. 4 is a top view of a semiconductor package according to another embodiment of the present invention.

As shown in FIGS. 3 and 4, the connection structure 212 can have a spot-like configuration 212a or a line configuration 212b. As shown in FIG. 3, the connection structure 212 may run on a section of the bottom periphery of the second semiconductor device 204 only. When the package is heated to a high temperature, moisture and pollutants vaporized from the second semiconductor device 204 and the substrate 206 can easily dissipate through the gaps in the connection structure 212. Hence, when the temperature drops, moisture and pollutants are prevented from re-condensing on the solder balls 214 to form an electrical bridge between neighboring solder balls 214. As shown in FIG. 4, the connection structure 214 may form a continuous wall on the bottom periphery of the second semiconductor 204 to enclose the space between the second semiconductor device 204 and the substrate 206 and prevent external moisture or pollutants from entering the sealed space.

In addition, the connection structure 212 is fabricated using a cured adhesive. By selecting a suitable adhesive (for example, a soft plastic material), the connection structure 212 can have the desired degree of flexibility so that the connection structure 212 may serve as a buffer to protect the semiconductor device 204 against shock.

Figure 5:
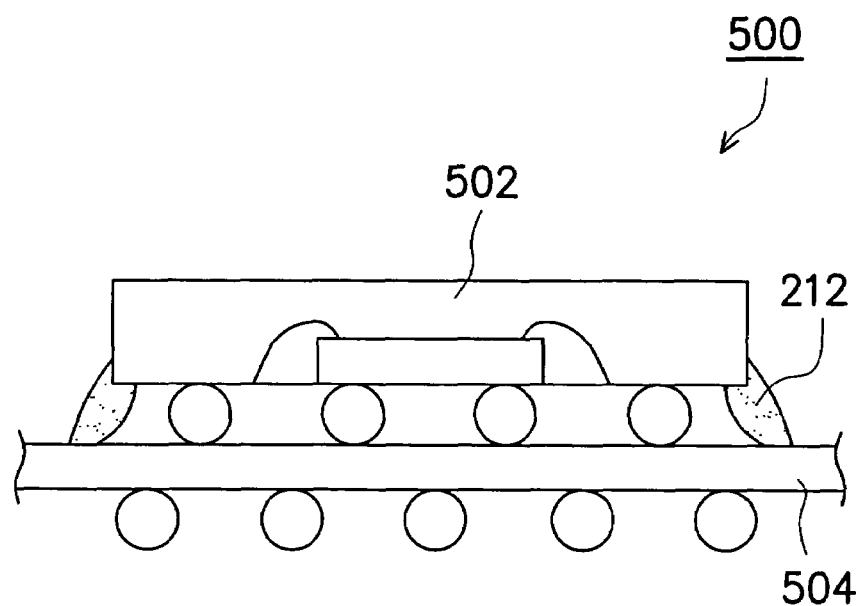
FIG. 5 is a schematic cross-sectional view of the semiconductor package shown in FIG. 4.

As shown in FIG. 5, the connection structure 212 of the present invention not only can be applied to mount a chip package to the packaging substrate of another chip package, but can also provides addition grip between a chip 502 having bumps thereon and a substrate 504.

Figure 6:
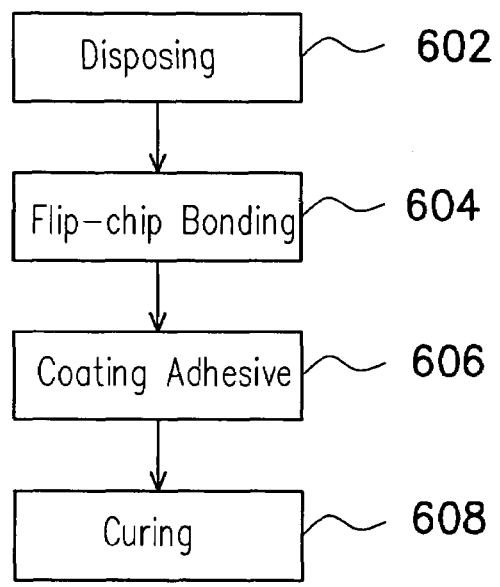
FIG. 6 is a flow chart showing the steps for producing a semiconductor package according to one embodiment of the present invention.

The present invention also provides a method of fabricating the aforementioned semiconductor package. FIG. 6 is a flow chart showing the steps for producing a semiconductor package according to one embodiment of the present invention. First, in step 602, (as shown in FIG. 2 and FIG. 5) the semiconductor device 204 (or the chip 502) is disposed on the substrate 206 (or the substrate 504). In step 604, the semiconductor device 204 (or the chip 502) is mechanically and electrically connected to the substrate 206 (or the substrate 504) by flip-chip bonding. In step 606, a suitable type of adhesive is coated on the bottom periphery of the semiconductor device 204 (or the chip 502). Hence, an adhesive structure having at least a spot-like or a line configuration is formed between the semiconductor device 204 (or the chip 502) and the substrate 204 (or the substrate 504). Finally, in step 608, the adhesive structure is cured to form a connection structure 212, for example, by heating or irradiating with ultraviolet light or an electron beam.

According to another embodiment of the present invention, the step 604 comprises a reflow process that includes heating the solder balls 214 to a reflow temperature and utilizing the solder balls 214 to connect the semiconductor package 204 and the substrate 206 together. In addition, step 606 can be carried out before step 604. By selecting an adhesive material having a curing temperature close to the reflow temperature of the solder balls, the adhesive material can be applied to the area between the bottom periphery of the semiconductor device 204 (or the chip 502) and the substrate 206 (or the substrate 504) first. In the subsequent reflow process, the high temperature in the flip-chip bonding process can be utilized to cure the adhesive structure so that a processing step and some processing time are saved.

The present invention requires the coating of adhesive along the bottom periphery of the semiconductor device 204 (or the chip 502) instead of injecting underfill material into the gap between the semiconductor device 204 (or the chip 502) and the substrate 206 (or the substrate 504). Hence, considerably less material is used. With a reduction in the amount of adhesive material, effusion of the adhesive material occurs less frequently. In addition, the process of producing the connective structure is simplified so that overall production rate of the connective structure can increase.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor package structure, comprising:
    a substrate;
    a semiconductor device, bonded to the substrate by a plurality of solder balls;
    at least a connection structure disposed between the semiconductor device and the substrate, and running along only a portion of a bottom periphery of the semiconductor package structure to bond the semiconductor device to the substrate, wherein the connection structure is not fully around the bottom periphery of the semiconductor device.

2. The semiconductor package structure of claim 1, wherein the connection structure includes a spot-like configuration.

3. The semiconductor package structure of claim 1, wherein the connection structure includes a line structure.

4. The semiconductor package structure of claim 1, wherein the connection structure comprises a soft plastic material that can increase the flexibility of the connection structure.

5. The semiconductor package structure of claim 1, wherein the semiconductor device comprises a semiconductor chip package.

6. The semiconductor package structure of claim 1, wherein the semiconductor device comprises a chip scale package.

7. The semiconductor package structure of claim 1, wherein the semiconductor device comprises a chip.

* * * * *